(12) United States Patent
Liu et al.

(10) Patent No.: US 11,114,272 B2
(45) Date of Patent: Sep. 7, 2021

(54) PULSED CFE ELECTRON SOURCE WITH FAST BLANKER FOR ULTRAFAST TEM APPLICATIONS

(71) Applicant: FEI Company, Hillsboro, OR (US)

(72) Inventors: Kun Liu, Portland, OR (US); Erik Kieft, Eindhoven (NL)

(73) Assignee: FEI Company, Hillsboro, OR (US)

( * ) Notice: Subject to any disclaimer, the term of this patent is extended or adjusted under 35 U.S.C. 154(b) by 12 days.

(21) Appl. No.: 16/583,163

(22) Filed: Sep. 25, 2019

(65) Prior Publication Data

US 2021/0090846 A1    Mar. 25, 2021

(51) Int. Cl.

| | |
|---|---|
| *H01J 37/16* | (2006.01) |
| *H01J 37/04* | (2006.01) |
| *H01J 37/073* | (2006.01) |
| *H01J 37/09* | (2006.01) |
| *H01J 37/10* | (2006.01) |
| *H01J 37/21* | (2006.01) |
| *H01J 37/26* | (2006.01) |

(52) U.S. Cl.
CPC .......... *H01J 37/165* (2013.01); *H01J 37/045* (2013.01); *H01J 37/073* (2013.01); *H01J 37/09* (2013.01); *H01J 37/10* (2013.01); *H01J 37/21* (2013.01); *H01J 37/26* (2013.01); *H01J 2237/026* (2013.01); *H01J 2237/043* (2013.01)

(58) Field of Classification Search
CPC .... H01J 37/28; H01J 1/304; H01J 2237/0432; H01J 1/142; H01J 1/144; H01J 1/148; H01J 2237/188; H01J 37/045; H01J 37/285; H01J 37/3174; H01J 9/025; H01J 1/14; H01J 1/3042; H01J 1/3044; H01J 2201/19; H01J 2201/30411; H01J 2201/30492; H01J 2235/086; H01J 2237/0437; H01J 2237/06341
USPC ....... 250/307, 310, 311, 396 R, 398, 440.11, 250/492.2, 492.22; 313/326
See application file for complete search history.

(56) References Cited

U.S. PATENT DOCUMENTS

| | | | | |
|---|---|---|---|---|
| 4,008,412 A | * | 2/1977 | Yuito | H01J 1/3042 313/309 |
| 5,661,307 A | * | 8/1997 | Tanaka | B82Y 10/00 250/398 |
| 5,911,919 A | * | 6/1999 | Billings | H01B 1/06 252/515 |
| 6,002,128 A | | 12/1999 | Hill et al. | |

(Continued)

OTHER PUBLICATIONS

Van Rens et al., "Dual mode microwave deflection cavities for ultrafast electron microscopy," available at: http://arxiv.org/pdf/1901.09579v1, pp. 1-5 (Jan. 28, 2019).

(Continued)

*Primary Examiner* — David A Vanore
(74) *Attorney, Agent, or Firm* — Klarquist Sparkman, LLP (57) ABSTRACT

Charged particle beams (CPBs) are modulated using a beam blanker/deflector and an electrically pulsed extraction electrode in conjunction with a field emitter and a gun lens. With such modulation, CPBs can provide both pulsed and continuous mode operation as required for a particular application, while average CPB current is maintained within predetermined levels, such as levels that promote X-ray safe operation. Either the extraction electrode or the beam blanker/deflector can define CPB pulse width, CPB on/off ratio, or both.

20 Claims, 11 Drawing Sheets

(56) References Cited

U.S. PATENT DOCUMENTS

| | | | |
|---|---|---|---|
| 6,190,579 B1* | 2/2001 | Billings | B82Y 10/00 252/515 |
| 2003/0094584 A1* | 5/2003 | Yui | B82Y 40/00 250/492.22 |
| 2007/0158581 A1 | 7/2007 | Ward et al. | |
| 2010/0224777 A1* | 9/2010 | Spallas | H01J 37/28 250/307 |
| 2011/0284744 A1* | 11/2011 | Zewail | H01J 37/28 250/307 |
| 2012/0138814 A1* | 6/2012 | Preikszas | H01J 37/1474 250/396 R |
| 2012/0261586 A1 | 10/2012 | Knippels et al. | |
| 2014/0103225 A1* | 4/2014 | Kieft | H01J 37/28 250/440.11 |
| 2015/0002009 A1* | 1/2015 | Zhang | H01J 9/025 313/46 |
| 2018/0151326 A1* | 5/2018 | Kieft | H01J 37/045 |
| 2020/0041428 A1* | 2/2020 | Yun | G01N 23/20075 |

OTHER PUBLICATIONS

Verhoeven et al., "High quality ultrafast transmission electron microscopy using resonant microwave cavities," available at: http://arxiv.org/pdf/1709.02205v2, pp. 1-5 (Apr. 23, 2018).
Partial European Search Report and Opinion issued in European Patent Application No. 20197328.6, dated Feb. 19, 2021, 15 pages.

\* cited by examiner

PULSED CFE ELECTRON SOURCE WITH FAST BLANKER FOR ULTRAFAST TEM APPLICATIONS

FIELD

The disclosure pertains to pulsed beam electron microscopy.

BACKGROUND

Transmission electron microscopy (TEM) uses a continuous electron beam with beam currents generally from about 30-50 pA to as much as a few nA. Higher beam currents are not used as they are associated with unsafe levels of X-ray generation.

While TEM columns can be provided with X-ray shielding, such shielding is only practical at beam currents of about 150 nA or less. For some applications, fast TEM is needed and could use, for example, picosecond electron beam pulses with a few electrons/ps or beam pulses of about 10 ns duration. In most fast TEM scenarios, pulsed beams can have peak currents of 1 µA or greater with repetition rates of at least 1 MHz. Such pulsed beams can be difficult to generate and produce unsafe levels of X-ray radiation, and improved approaches are needed.

SUMMARY

Disclosed herein are methods and apparatus that permit generation of charged particle beams (CPBs) having pulsed and/or continuous components that can control X-rays generated by the CPBs. In a representative example, a CPB system comprises a CPB source adapted to produce a CPB having a pulsed CPB component or a continuous CPB component, or both a pulsed CPB component and a continuous CPB component. A CPB lens is situated to receive the CPB from the CPB source and is coupled to a controller to produce the continuous CPB component by energizing the CPB lens to produce an expanded CPB at a beam limiting aperture so that a portion of the expanded CPB is transmitted. Alternatively, the controller energizes the CPB lens to focus the CPB to substantially transmit a CPB portion associated with the pulsed component. In some examples, an aperture plate defines the beam limiting aperture and the CPB source comprises a field emitter such as a LaB$_6$ nanorod. In representative examples, the CPB source includes an extraction electrode situated to establish a beam current of at least one of the pulsed CPB component and the continuous CPB component. In some cases, the CPB controller is coupled to the extraction electrode and is operable to establish a beam current of at least one of the pulsed CPB component and the continuous CPB component. In still other examples, a beam blanker is situated to receive the CPB from the beam limiting aperture and the CPB controller is operable to energize the beam blanker to selectively deflect the received CPB. In other representative embodiments. a blanking aperture plate defines a blanking aperture, and the beam blanker is operable to selectively deflect the CPB to the blanking aperture to block at least a portion of the CPB. In representative examples, the beam blanker comprises an electrostatic deflector or an RF resonant cavity. In typical examples, the controller is coupled to the CPB lens to focus the CPB at the beam blanker. In other representative examples, X-ray shielding is situated about a CPB beam axis and defines an X-ray shielded region, wherein the beam limiting aperture is situated within the X-ray shielded region. In still further examples, the CPB source is situated to direct the CPB to be blocked by the blanking aperture when the beam blanker is not actuated and the CPB lens is configured to produce a CPB focus situated between the beam limiting aperture and the blanking aperture.

Representative methods comprise selecting either a first CPB beam focus or a second CPB beam focus, wherein the first beam focus is situated to substantially attenuate a CPB by transmitting only a portion of the CPB through a beam limiting aperture, and the second CPB focus is situated so that the CPB is substantially transmitted by the beam limiting aperture. With the first CPB focus selected, a CPB source is activated to produce at least a continuous component of the CPB and the continuous component is directed to a target. With the second CPB focus selected, a CPB portion associated with the pulse component is produced and directed to a target.

In some cases, the continuous component is produced with a field emitter in response to continuous activation of an extractor and the pulsed component is produced with the field emitter and pulsed activation of the extractor. In other examples, the pulsed component is produced with a beam blanker. In additional examples, the CPB portion associated with the pulsed component is directed to the beam blanker, and selectively attenuated to define a CPB pulse duration or a CPB contrast ratio, or both a CPB pulse duration and contrast ratio. In other examples, with the second focus selected, the pulsed component is produced with the beam blanker to have a predetermined pulse duration, contrast ratio, or both pulse duration and contrast ratio. In other examples, the beam limiting aperture is situated in an X-ray shielded region.

Still further methods comprise providing a CPB source that includes a field emitter and an extractor and situating a CPB lens to receive a CPB from the CPB source. A beam limiting aperture is situated in an X-ray shielded region. A controller is coupled to the CPB lens to produce a CPB focus at the beam limiting aperture to produce a pulsed CPB or to produce an expanded beam at the beam limiting aperture to produce a continuous CPB.

Charged-particle-beam systems comprise a pulsable CPB source adapted to produce a CPB having at least a pulsed CPB component and a CPB blanker situated to receive at least the pulsed CPB component. A blanking aperture is situated to receive the pulsed CPB component from the CPB blanker, wherein the CPB blanker is operable to selectively direct the pulsed CPB component to a specimen or to block at least a portion of the pulsed CPB component. In representative embodiments, the pulsable CPB source is adapted to produce a CPB having the pulsed component and a stationary component. In some examples, the pulsable CPB source comprises an extraction electrode situated to establish a beam current of at least one of the pulsed beam component and the stationary beam component. In further examples, a CPB lens situated to focus the CPB at the beam blanker. In other examples, X-ray shielding is situated about a CPB beam axis and defines an X-ray shielded region. An aperture is situated within the X-ray shielded region, and the CPB is configured to focus the CPB so that an expanded CPB is incident to the aperture situated within the X-ray shielded region. In still more examples, the CPB source is situated to direct at least one of the pulsed component and the stationary component of the CPB so as to be blocked by the blanking aperture when the beam blanker is unactuated. A controller is operable to select at least one delay between application one or more of the voltage to the extractor, the beam blanker drive signal, and a stimulus signal applied to the specimen. In typical examples, the pulsed component of the CPB comprises pulses of durations less than 100 ns, 50 ns, 10 ns, 1 ns, 100 ps, 50 ps, 10 ps, or 1 ps at repetition rates of at least 100 kHz, 1 MHz, 10 MHz, 50 MHz, 100 MHz, 500 MHz, or 1 GHz.

Representative methods include providing a CPB that includes a pulsed component and a stationary component and directing the CPB to a beam blanker. At least one of the pulsed component and the stationary component is attenuated. Typically, the beam blanker attenuates the stationary component and transmits the pulsed component. In some cases, a ratio of a pulsed component beam current and a stationary beam current is selected, and a beam blanker is activated to direct a beam associated with the selected ratio to a specimen. In some cases, the CPB is focused optically upstream of an X-ray shielded region, and a CPB is delivered to the beam blanker with an aperture situated in the X-ray shielded region. In some examples. the pulsed component beam current is produced by applying a pulsed voltage to an extractor. In other examples, the pulsed voltage is synchronously applied to the extractor and the beam blanker is activated. In representative examples, a duration of a CPB pulse applied to a specimen is defined with the beam blanker. In typical examples, the CPB is an electron beam. In additional examples, an image of the specimen is based on the pulsed component of the CPB.

Additional methods comprise producing a pulsed CPB by applying a pulse drive to a CPB source to produce a CPB having a pulsed component and a stationary component. The pulsed component is selectively attenuated to reduce a pulse duration or the stationary component is attenuated to produce a predetermined ratio of pulsed current to stationary current. The pulsed CPB is directed to a specimen and a response of the specimen to the pulsed CPB is recorded. The recorded response to the pulsed CPB is a TEM image, an SEM image, or an energy spectrum of charged particles received from the specimen. In other examples an optical or electrical stimulus is applied to the specimen, and responses of the specimen to the optical or electrical stimulus are obtained at two or more relative delays between the optical or electrical stimulus and the pulses of the pulsed CPB.

A representative method of producing CPB pulses comprises directing a CPB to a beam blanker and selectively activating the beam blanker so that the CPB is blocked by an aperture.

The foregoing and other features, of the disclosed technology will become more apparent from the following detailed description, which proceeds with reference to the accompanying figures.

BRIEF DESCRIPTION OF THE DRAWINGS

FIGS. 3A-3B illustrate representative CPB systems that produce CPB pulses. As shown in FIG. 3A, high brightness pulses and low average beam currents are produced. In FIG. 3B, lower brightness is available, but average beam currents are higher than in FIG. 3A.

DETAILED DESCRIPTION

Disclosed herein are approaches to modulating charged particle beams (CPBs) such as electron beams to produce unique pulsed/continuous beams for use in TEM, SEM, electron spectroscopy, and other applications, With the disclosed modulation strategy, both time resolution and background suppression can be improved dramatically in Ultrafast TEM applications, while the average CPB current within the microscope can be easily controlled below X-ray radiation safety limits, even in applications using high CPB current or high brightness. The features of any of the examples set forth below can be combined with features of any other example, and the particular embodiments are selected for illustration. In some examples, the pulsed CPB methods and apparatus are used in CPB microscopy, and in some cases, portions of a CPB column (CPB lenses, stigmators, specimen stages, vacuum chambers, etc.) are omitted for convenient illustration, but such components and/or SEM or TEM systems are typically included. In addition, in the disclosed examples, CPBs are directed through apertures defined in aperture plates. However, separate aperture plates are not required, and one or more CPB optical elements such as CPB lenses can be used to define apertures. Apertures are not required, and suitable beam obstructions can be obtained with components in other ways such as with component edges. Moreover, apertures need not be circular but can have arbitrary shapes such as ovoids, polygons, ellipses, or others. Devices using to deflect beams and serve as beam blankers can be coupled so that as unenergized, and average CPB currents are maintained at suitable values outside of regions that are not appropriately X-ray shielded. For example, to produce CPB pulses, a beam blanker can be driven to deflect a CPB to be transmitted to a specimen. In such a configuration, a CPB is normally blanked, and then unblanked to produce CPB pulses. As used herein, a beam blanker selectively permits portions of a CPB to propagate to a target of interest. Typical examples are electrostatic deflectors such as deflection plates and resonant RF cavities. With the disclosed methods, systems, and apparatus, average CPB current can be controlled based on one or more limits such as a limit associated with X-ray safety Example 1

Figure 1:
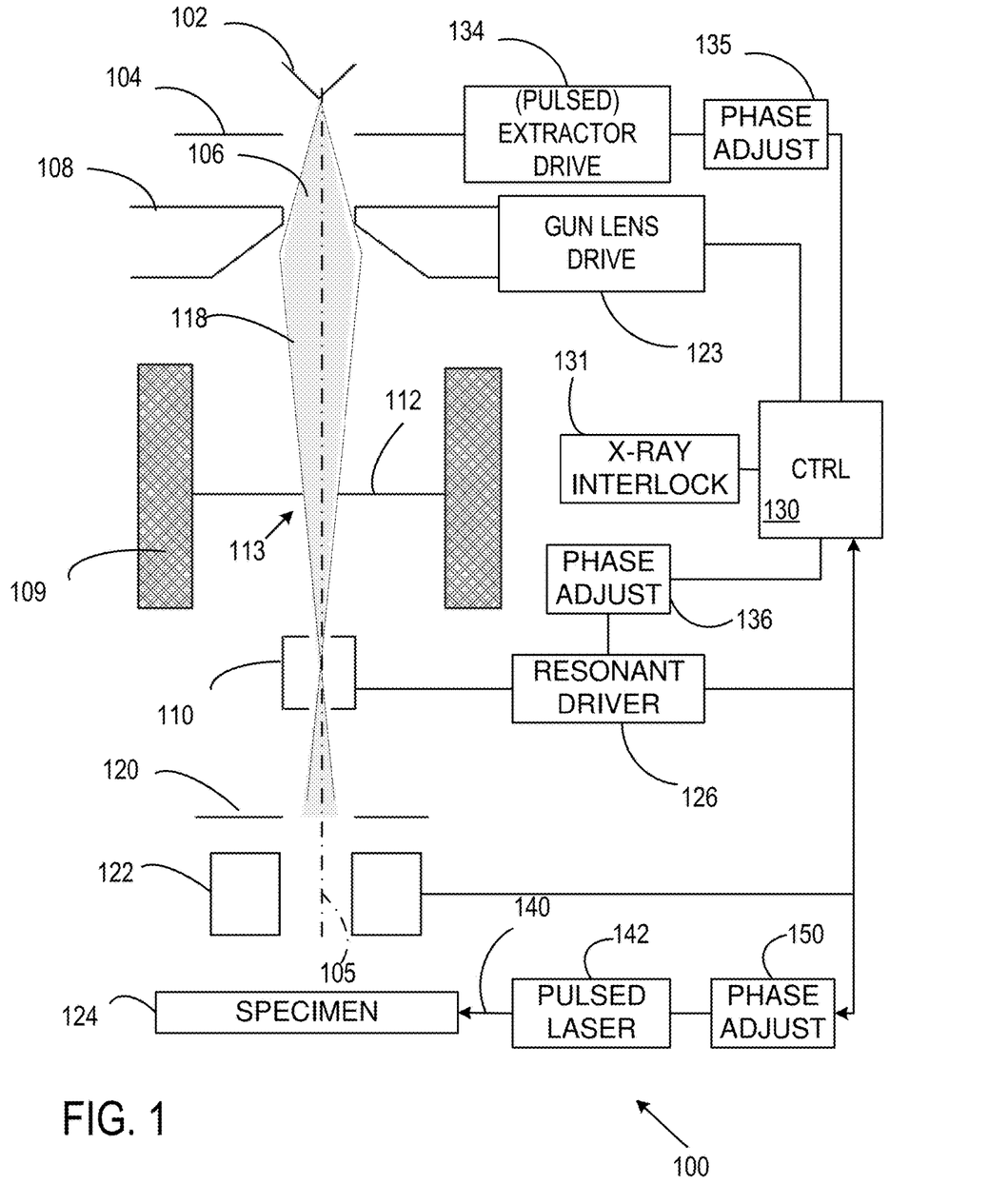
FIG. 1 illustrates a representative CPB system that includes a resonant beam deflector.

Referring to FIG. 1, a representative CPB system 100 includes a charged particle beam (CPB) emitter 102 proximate an extractor or extractor electrode 104 that is situated to produce or control CPB emission from the CPB emitter 102. In some examples, CPBs are produced using field emission, and the CPB emitter 102 and the extractor 104 form a field emitter device. For example, the CPB emitter 102 can be a LaB$_6$ field emitter that is situated proximate an extractor electrode that produces an extraction electric field. A CPB 106 from the CPB emitter 102 is directed along an axis 105 and is focused by a gun lens 108 as controlled by a voltage or other electrical signal from a gun lens drive 123 to form a focused beam 118. An aperture plate 112 includes an aperture 113 situated along the axis 105 to transmit the focused beam 118 to a resonant cavity deflector 110. The aperture plate is 112 is typically situated in an X-ray shielded region defined by X-ray shielding 109. A resonant cavity driver 126 is situated to apply a voltage to the resonant cavity deflector 110 at or near a resonance frequency to deflect the focused CPB 118. An aperture plate 120 is situated to block at least portions of the focused CPB 118 in response to a deflection produced by the resonant cavity deflector 110. A CPB beam portion transmitted by the aperture plate 120 is focused, scanned, or otherwise processed with a CPB optical element 122 and then delivered to a specimen 124.

A controller 130 is coupled to an extractor driver 134 that provides a pulsed extraction signal (typically, an extraction voltage) to the extractor 104. A relative phase of the pulsed extraction signal can be set by the controller 130 or a separate phase adjuster 135 can be provided. The controller 130 is also coupled to the resonant cavity driver 126, and a separate phase adjuster 136 can be provided, or resonant cavity drive signal phase can be directly established by the controller 130. In addition, the controller 130 is coupled to the CPB optical element 122. X-ray interlock logic 131 or other controls can be provided so that the CPB is not energized or energized suitably for X-ray safe operation regardless of user or other inputs.

In the example of FIG. 1, a pulsed laser 142 is situated to direct laser pulses 140 or a continuous or modulated laser beam to the specimen 124. A phase adjuster 150 can be provided so that extractor pulses, resonant drive signals, and laser pulse are suitably synchronized. In some examples, a relative phase of CPB pulses and laser pulses is scanned to produce specimen response as a function of relative delay. Relative phases can be established based on a clock signal provided by any of the pulsed laser 142, the controller 130, or the resonant driver 126 as may be convenient. In some cases, phase control of a pulsed laser is relatively difficult, and phases of electrical drive signals provided to the extractor and the resonant cavity are adjusted.

In some examples, a beam deflector such as the resonant cavity beam deflector 110 and an associated aperture are situated so that with the beam deflector unactuated, CPB current in any regions lacking suitable X-ray shield is limited to avoid exposure to unsafe levels of X-radiation. For example, an undeflected CPB can be blocked by an aperture plate in an X-ray shielded region, and energization of a beam deflector used to direct the CPB through an aperture to a target.

Either a first CPB beam focus or a second CPB focus can be selected. The first CPB focus is situated to substantially attenuate a CPB at the beam limiting aperture, and the second CPB focus is situated so that the CPB is substantially transmitted by the beam limiting aperture. With the first CPB focus selected, the CPB source is activated to produce at least a continuous component of the CPB that is directed to the target. With the second CPB focus selected, at least a pulsed component of the CPB is produced and directed to the target.

Example 2

Figure 2A:
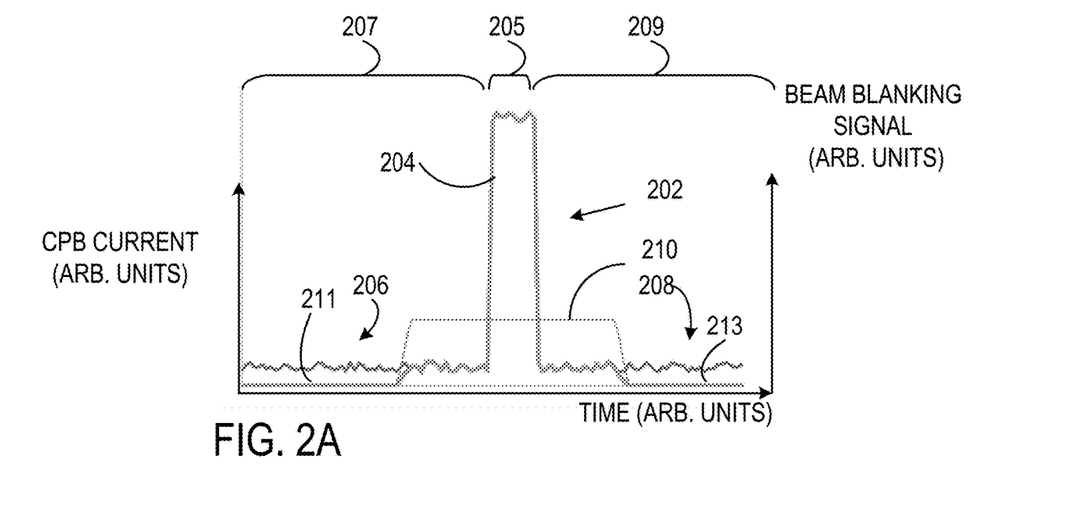
FIGS. 2A-2B illustrate generation of representative CPB pulses.

Referring to FIG. 2A, CPB current 202 as a function of time is graphed, illustrating a pulsed portion 204, a pre-pulse portion 206, and a post-pulse portion 208 in respective time intervals 205, 207, 209. CPB current in the pulse portion 204 can be substantially higher than CPB current in the pre-pulse portion 206 or the post-pulse portion 208. A beam blanking or beam gating signal 210 is timed so that the pulsed portion 204 of the CPB continues to be available or is transmitted to additional CPB optical elements and to a specimen while the pre-pulse portion 206 and the post-pulse portion 208 are attenuated as shown at 211, 213, respectively. In this way, a contrast ratio (CPB pulsed current/CPB non-pulsed current) is increased. and CPB pulse duration is largely unchanged.

Figure 2B:
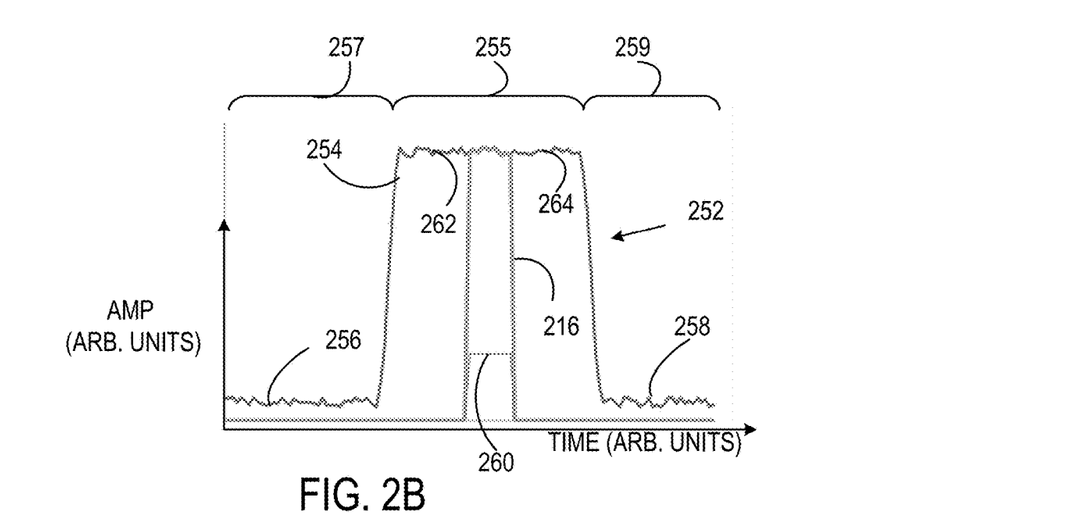

Referring to FIG. 2B, CPB current 252 as a function of time is graphed, illustrating a pulsed portion 254, a pre-pulse portion 256, and a post-pulse portion 258 in respective time intervals 255, 257, 259. A beam blanking or beam gating signal 260 is timed so that the pulsed portion 254 of the CPB is temporally windowed, reducing pulse duration. CPB pulse portions 262, 264 and pre- and post-pulse portions 256, 258 are attenuated. In this way, CPB pulse duration can be reduced, and in some cases, contrast ratio is also increased.

By controlling beam gating or beam blanking to produce the CPB currents illustrated in FIG. 2A or FIG. 2B, average beam current can be reduced, promoting X-ray safety, while providing short duration CPB pulses or CPB pulses with higher contrast ratios.

Example 3

Figure 3A:
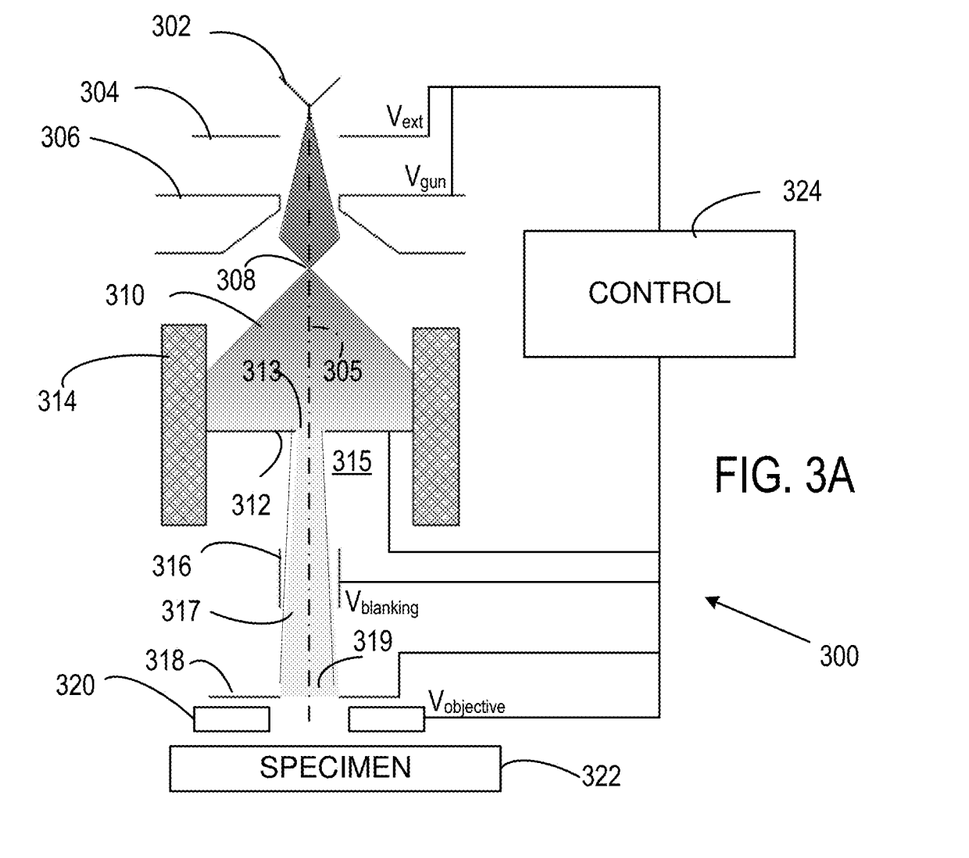

Referring to FIG. 3A, a CPB system 300 includes a CPB emitter 302 situated proximate an extraction electrode 304. A gun lens 306 is situated to receive an emitted CPB and form a CPB focus 308, producing an expanding beam 310. The gun lens 306 can also be activated to produce a CPB that is focused elsewhere along an axis 305. An aperture plate 312 is situated within X-ray shielding 314 to receive the expanding beam 310 and transmit an apertured beam 317 through an aperture 313. The total beam current in the apertured beam 317 is reduced from that of the expanding beam 310, and CPB portions that are not transmitted are directed to the aperture plate within an X-ray shielded region. However emitted beam current from the CPB emitter 302 can be selected to provide a selected brightness (current/area/steradian), typically a high brightness and by aperturing the expanding beam 310, average or continuous CPB current can be controlled. With such an arrangement, average CPB current outside of X-ray shielded regions can be reduced, while CPB current is apertured or otherwise attenuated within a shielded region, promoting X-ray safety.

In addition to providing high CPB brightness in a continuous beam, CPB pulses can also be generated. The apertured beam 317 is directed to a beam blanker 316 that can direct the apertured beam 317 to an aperture plate 318 defining an aperture 319 so that some or all of the apertured beam 317 can be further attenuated and then focused or otherwise processed with one or more CPB lenses, deflectors, or other optical elements such as an objective lens 320 and directed to a specimen 322.

In the example of FIG. 3A, a controller 324 is coupled to the extraction electrode 304 to apply an extraction voltage $V_{ext}$ that regulates CPB emission from the CPB emitter 302. In other examples, one or more similar CPB optical elements are situated and controlled to regulate current from a CPB source such as a field emitter, a thermal source, a pulsed laser based source, or other CPB source. The controller 324 is also coupled to the gun lens to apply a lens control voltage $V_{gun}$ to focus the emitted CPB as needed, to the beam blanker 316 to apply a voltage $V_{blanking}$, and to the lens 320 to apply a voltage $V_{objective}$ that shapes the CPB at the specimen 322. As shown, controls are applied as control voltages, but can be provided by other electrical signals as well. In addition, one or more signal sources (such as voltage sources) are arranged to provide the necessary voltages or other electrical signals, typically as directed by the controller 324, but are not shown in FIG. 3A. However, in some cases, the controller 324 can include a digital to analog convertor (DAC) that can provide any necessary voltages. The controller 324 can also be coupled to one or more of the aperture plates 312, 318 so that incident beam current is measured. Alternatively, one or more other CPB detectors can be provided elsewhere along the axis 305.

The gun lens 306 can be used to adjust CPB current available for delivery to a specimen. With a suitable gun voltage $V_{gun}$ applied to produce a beam that is significantly attenuated by the aperture plate 312 (i.e., sufficiently diverging), average beam current outside of an X-ray shielded region 315 can be made sufficiently low to reduce X-emissions outside of the shielded region 315. In other cases, the gun lens 306 produces a CPB with a lesser divergence or that is focused at the aperture 313. In addition, the controller 324 can measure beam current at, for example, the aperture plate 318 to confirm that the CPB current is appropriate. One or more of the gun lens 306, the extractor electrode 304, and the beam blanker 316 can be controlled to maintain appropriate CPB current.

The beam blanker 316 can be driven to set a CPB pulse duration, increase CPB on/off ratio (contrast ratio), or otherwise modify the CPB that is to be incident to the specimen 322. In the example of FIG. 3A, high brightness is available, average beam current is controlled, and CPB pulses can be produced and shaped with one or both of the CPB source 302 and the beam blanker 316.

In still further examples, beam limiting is done with an aperture plate that is situated along the CPB column prior to significant beam acceleration. In this way, high average beam current is incident to the aperture plate with relatively low energy, reducing X-ray generation.

Example 4

Figure 3B:
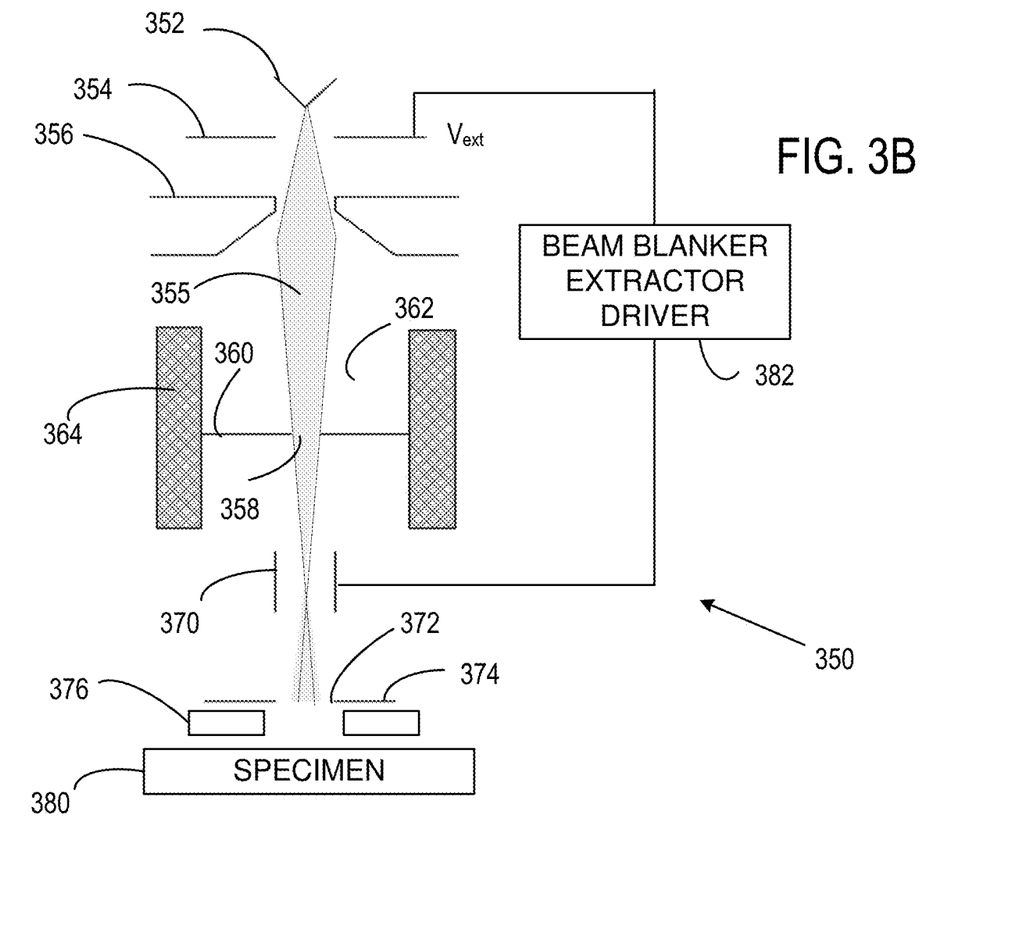

In the example of FIG. 3A, a relatively high CPB current is reduced by expanding a CPB and transmitting only a portion. In FIG. 3B, a CPB system 350 is configured to produce a lower average beam current, and boost beam current during CPB pulses. As shown in FIG. 3B, a CPB system 350 includes a CPB emitter 352 situated proximate an extraction electrode 354. A gun lens 356 is situated to receive an emitted CPB and form a CPB 355 that is directed through an aperture 358 defined in an aperture plate 360. In this example, the aperture 358 tends to shape the CPB 355 and slightly or modestly attenuate the CPB 355, but substantial attenuation is not needed to regulate X-ray emissions as average beam current is suitably controlled. The aperture plate 360 can be situated in an X-ray shielded region 362 as defined by X-ray shield 364. From the aperture 358, the beam propagates to a beam blanker 370 that includes one or more deflection plates. Typically, the CPB 355 is focused near or within the beam blanker 370. An additional aperture 372 defined in an aperture plate 374 and an objective lens 376 shape the CPB for delivery to a specimen 380. With the arrangement of FIG. 3B, a relatively low average CPB current is used to reduce X-ray emission, and CPB current is pulsed using the extractor 354 in response to voltage(s) applied by a beam blanker/extractor driver 382. The beam blanker 370 is driven to increase on/off ratio, further limit pulse duration, or both.

In the example of FIG. 3B, the beam blanker/extractor driver 382 is coupled to the extraction electrode 354 to apply an extraction voltage $V_{ext}$ that regulates CPB emission from the CPB emitter 352 and to the beam blanker 370. In other examples one or more similar CPB optical elements are similarly situated and controlled to regulate current from a CPB source such as a field emitter, a thermal source, or other CPB source. Other lenses and elements can be coupled to suitable control voltage sources as well, and each or some components can use individual driver circuitry as may be convenient.

Either of the CPB systems 300, 350 can be operated to provide a high brightness, low average current CPB.

Example 5

Figure 4:
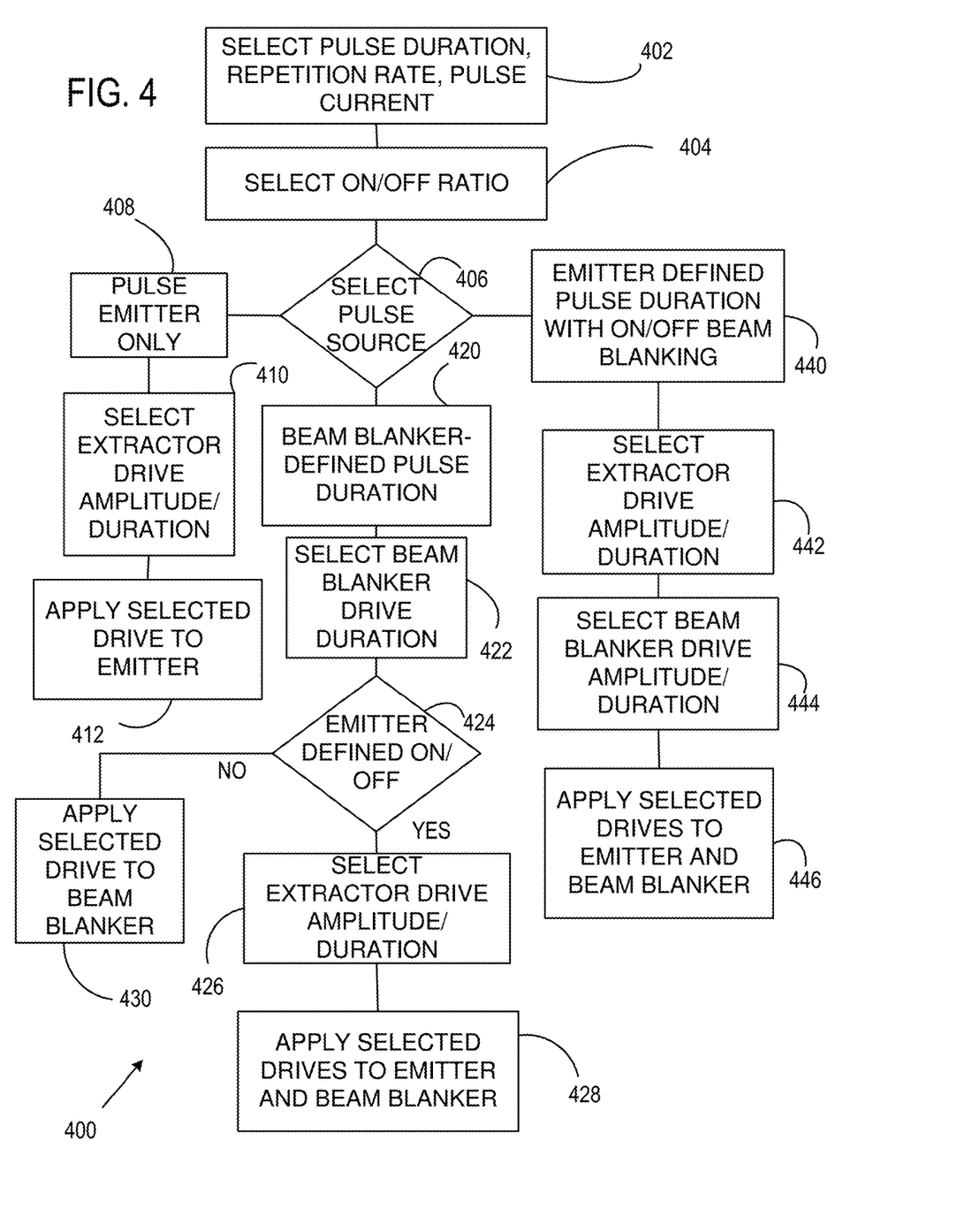
FIG. 4 illustrates a representative example of a method of producing CPB pulses.

Referring to FIG. 4, a method 400 of providing a pulsed CPB to a specimen includes selecting a pulse duration, repetition rate, and pulse current at 402. At 404, a contrast ratio is selected and at 406 a pulse source is selected. For example, a CPB emitter can be chosen at 408, and suitable CPB extractor pulse drive amplitude and duration selected at 410. At 412, the selected CPB extractor pulse drive is applied, and a specimen exposed to the pulsed CPB.

Alternatively, pulse duration is to be defined with a beam blanker as selected at 420, and one or both of a suitable beam blanker drive amplitude and duration are selected at 422. At 424, it is determined if a CPB emitter is to be pulsed as well. If so, an extractor pulse drive amplitude and/or duration are selected at 426, and at 428, the selected extractor drive and beam blanker drives are applied and a specimen exposed to a pulsed CPB. If the emitter is not to be pulsed, the selected beam blanker drive is used to deliver a pulsed CPB to a specimen at 430.

In some cases, the emitter is to be pulsed and beam blanking is used to set pulse duration and on/off ratio as selected at 440. In this case, extractor drive amplitude and duration are selected at 442, and beam blanker drive amplitude and duration are selected at 444. The extractor drive and blanker drive are applied at 446 for exposure of a specimen.

In further examples, a relative timing or phase of the extractor drive and the blanker drive can be selected. For example, if the extractor produces a CPB current that increases gradually, the blanker drive can be applied after the CPB current has reached a suitable value. In general, relative timing can be selected to produce current pulses that are substantially the same from pulse to pulse, or vary in a predictable manner, or otherwise modulate a CPB.

The method 400 of FIG. 4 refers to controlling CPB current by varying an extractor drive such as an applied voltage. Other CPB current sources can be modulated in other ways, and extractor-based modulation of a field emitter is a convenient, practical example. In addition, average CPB current can be estimated and drive values selected so that CPB current does not tend to produce undesirable levels of X-ray radiation, particularly in any regions of a CPB apparatus that do not include X-ray shielding.

Example 6

Figure 5:
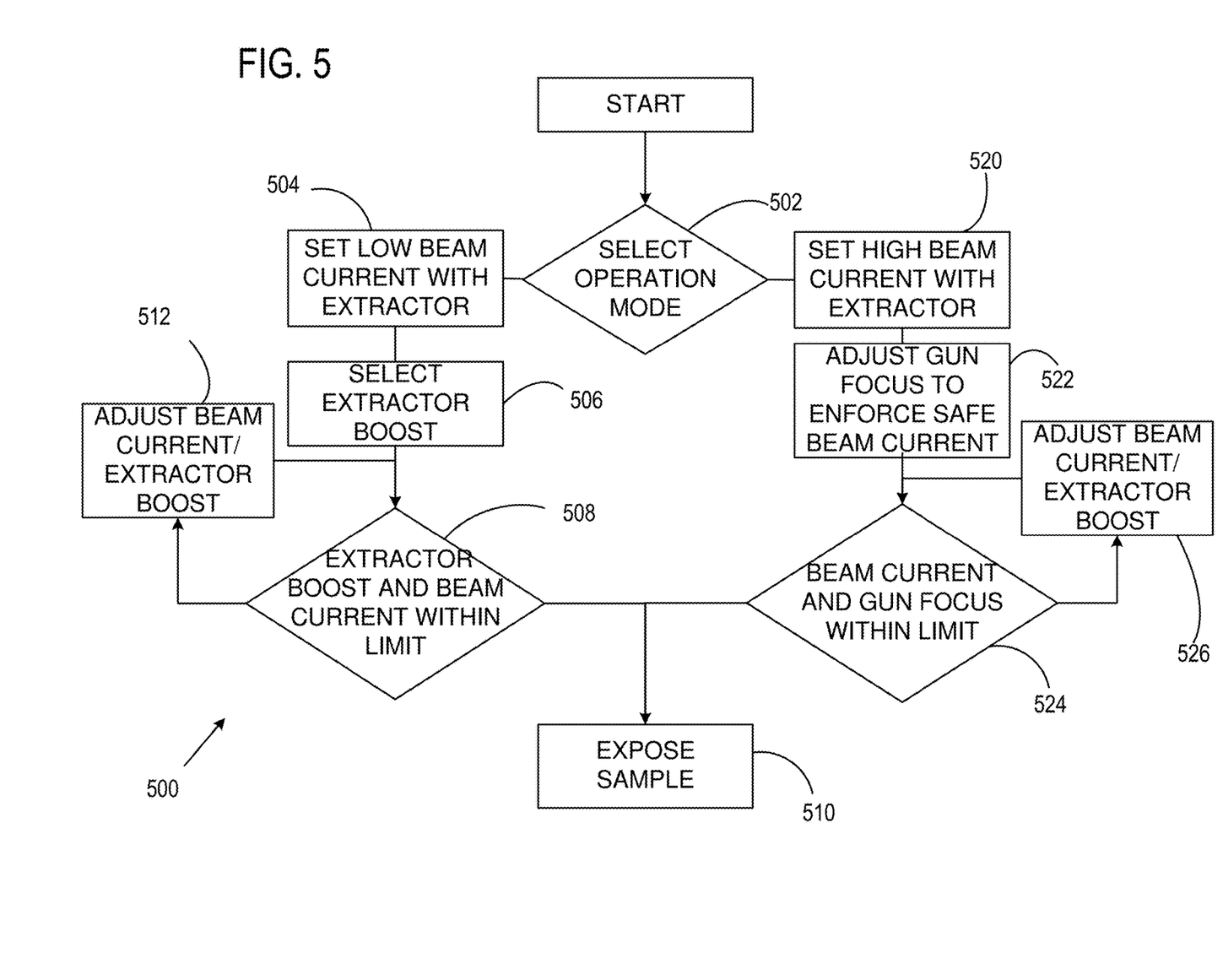
FIG. 5 illustrates another representative example of a method of producing CPB pulses.

With reference to FIG. 5, a CPB method 500 includes selecting a mode of operation at 502 based on an intended average CPB current. In one case, a low continuous CPB current is established such as with an extractor at 504. A suitable extractor boost can be selected at 506 to produce larger pulsed CPB currents. If this "boosted" CPB current is associated with an average CPB current that is within a predetermined limit, a corresponding CPB current can be produced and the sample exposed to the CPB at 510. Otherwise, the beam current or the extractor boost can be adjusted at 512 and re-evaluated at 508. If a suitable CPB current cannot be achieved, a technician can be notified.

If a relatively high CPB current is selected at 520, a gun lens voltage or other gun control is adjusted at 522 so that the CPB is attenuated by, for example, directing a large area beam to an aperture. At 524, the CPB current can be evaluated to verify that an average CPB current is within a predetermined limit although selection of the continuous CPB current is generally sufficient for X-ray safe operation. If so, a sample is exposed at 510. Otherwise, CPB current and the extractor boost are revised at 526. If suitable values cannot be found, a technician can be notified.

Example 7

Figure 6A:
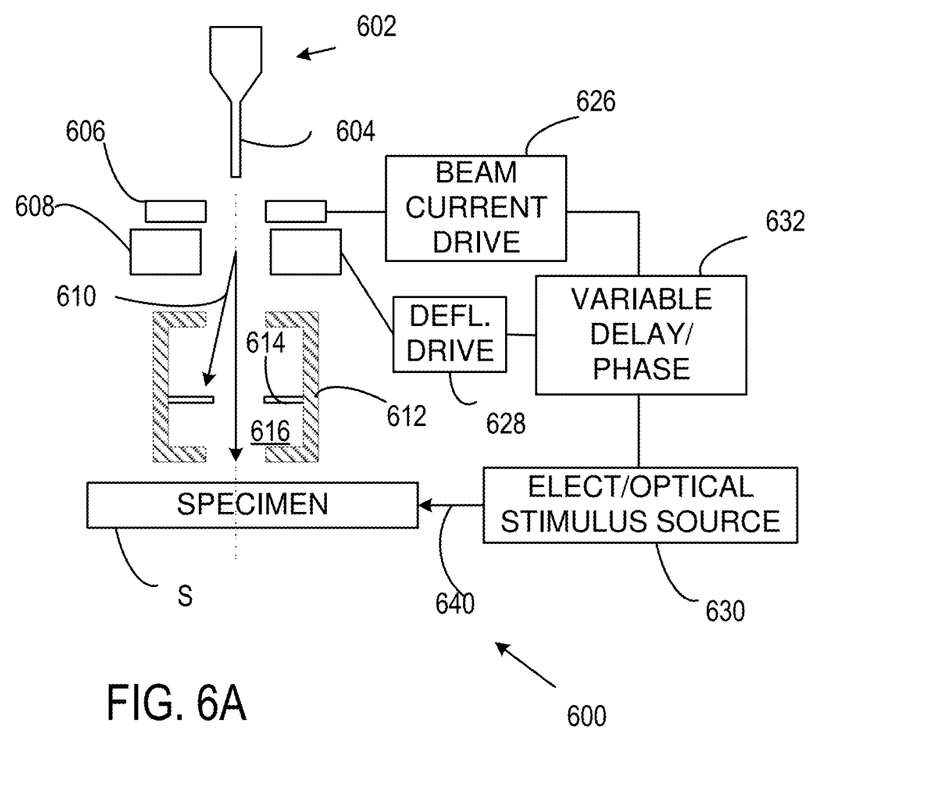
FIG. 6A illustrates a representative CPB system that includes a nanorod field emitter.

Referring to FIG. 6A, a CPB system 600 includes a CPB emitter 602 having a field emissive nanorod 604 that produces a CPB as controlled by an extractor 606. A CPB deflector 608 deflects the CPB so that it is attenuated within an X-ray shielded region 616 defined by an enclosure 612. The CPB can be partially or completely blocked by an aperture plate 614 based on an applied deflection signal. In this example, a deflected CPB 610 is produced in response to an applied deflection signal. A deflector driver 628 and a beam current driver 626 are coupled to the CPB deflector 608 and the extractor 606, respectively. An electrical or optical signal source 630 provides electrical or optical stimulus signals 640 to a specimen S, and a phase controller 632 adjusts and controls relative phases (delays) to provide CPB pulses at suitable delays or advances with respect to the electrical or optical stimulus signals.

Typical nanorod field emitters are less than 5 µm long, such as less than or equal to 4 µm, 3 µm, 2 µm, 1 µm, or 0.5 µm, and have diameters less than or equal to 300 nm, such as 200 nm, 150 nm, 100 nm, or 50 nm.

The beam current drive 626 generally provides a drive signal having a continuous component and a pulsed component. As discussed above, the CPB deflector 608 can improve pulse contrast ratio or limit pulse duration, or both. Increasing contrast ratio can be especially important in applications with low pulse duty cycles as average CPB current can be substantially larger than pulsed CPB current. For example, with a ratio of pulsed to continuous current of 100, in applications with duty cycles of $10^{-5}$, average continuous CPB current is 1000 larger than average pulsed current. In most cases, average CPB current (based on both continuous and pulsed components of a CPB) is controlled to be less than a predetermined limit, such as an X-ray safety limit associated with the configuration of the CPB system 600. In some examples, a CPB deflector is not used, and the drive signal from the beam current drive 626 and the resulting CPB is sufficient. In a "high brightness" mode, average CPB current is limited by expanding a CPB and attenuating the CPB with an aperture. In a "low brightness" mode, average CPB current is limited with an extractor voltage, and a suitable low continuous current is produced.

Example 8

Figure 6B:
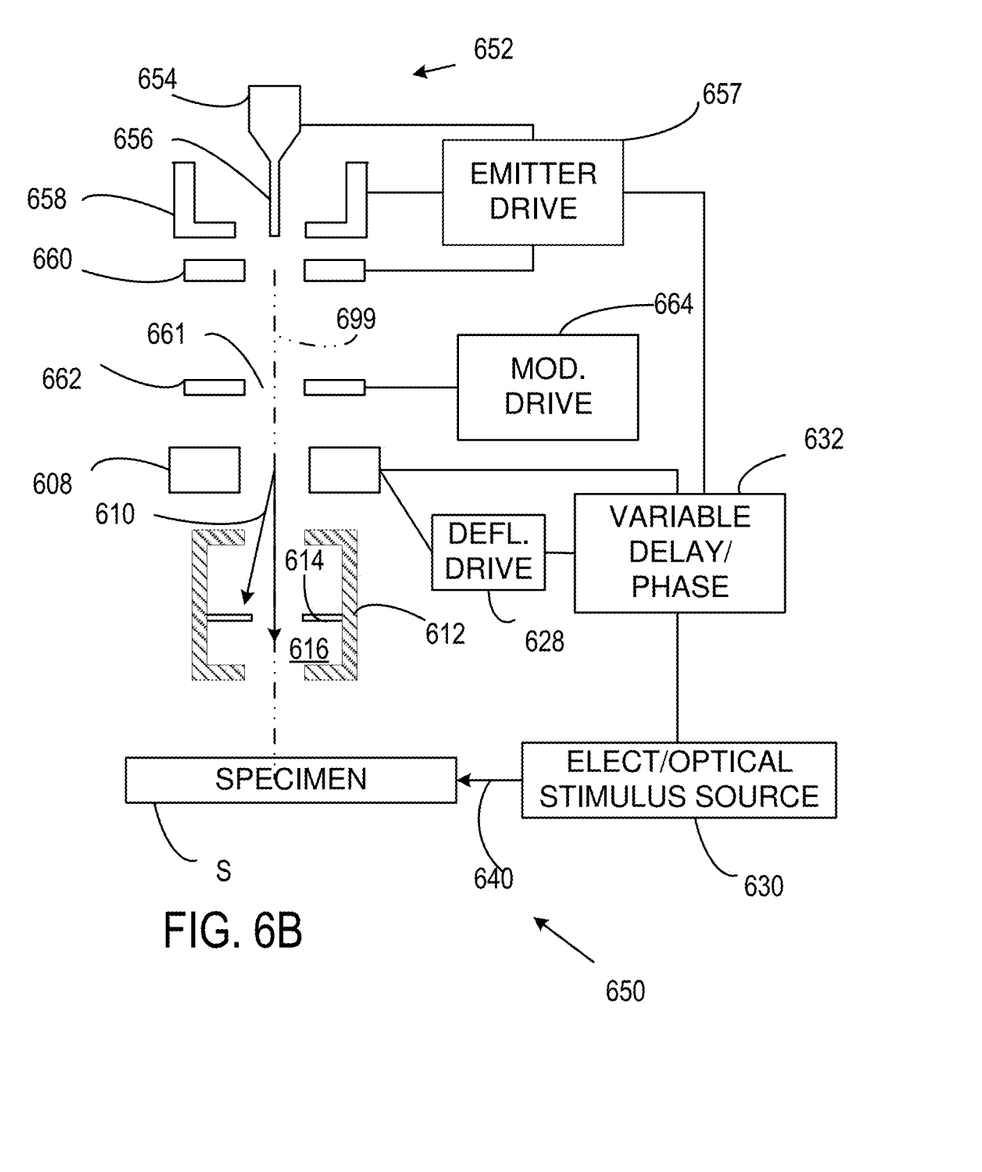
FIG. 6B illustrates a representative CPB system that includes a field emitter that provides a variable current using a variable drive applied to one or more of an emitter tip, a suppressor electrode, or an extractor electrode.

Referring to FIG. 6B, a CPB system 650 includes a CPB emitter 652 having a field emitter 654 that produces a CPB from an emitter tip 656. CPB current can be controlled by one or more of a voltage applied to the field emitter 654 or emitter tip 656 as provided by an emitter drive 657. A suppressor electrode 658 is situated about the field emitter 654, typically to suppress stray charged particle emissions, and an extractor electrode 660 is situated to establish a voltage with respect to the emitter tip 656 to induce a selected CPB current. As shown in FIG. 6B, any or all of the suppressor electrode 658, the extractor electrode 660, and the field emitter 654 or emitter tip 656 can be controlled with the emitter drive 657 to produce a continuous component of a CPB or to produce a pulsed or other variable CPB component, or to produce both the continuous component and the pulsed component. In some examples, one or more additional beam apertures are situated along a CPB system axis 699 and can be used to control one or both of the continuous and pulsed or variable CPB components. For example, an aperture 661 defined in an aperture plate 662 can be controlled with a modulator drive 664 to control CPB current. The beam deflectors, X-ray shielding, and other features of the CPB system shown in FIG. 6A can be used after the aperture 661, but additional apertures can be situated in this portion of the CPB path as well. The examples of FIGS. 6A-6B can also provide beam modulation using a gun lens, but such a lens is not shown. In addition to the CPB modulations provided by driving one or more CPB lenses, deflectors, aperture plates or other CPB optical elements, pulse and/or continuous CPB emissions can be produced in response to irradiation of a suitable target with a continuous, pulsed, or modulated optical beam or beams. Such CPBs can be further modulated using CPB optical elements as needed.

Example 9

Figure 7A:
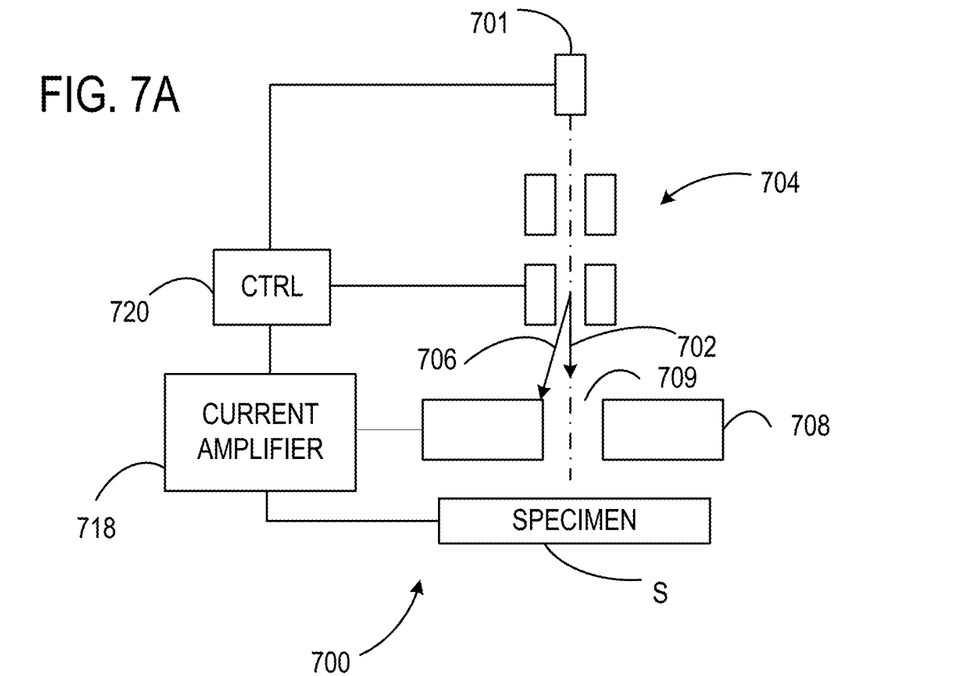
FIGS. 7A-7B illustrate representative CPB systems that produce CPB pulses.

With reference to FIG. 7A, a CPB system 700 includes a CPB source 701 that directs a CPB 702 to a CPB deflector 704 that is operable to produce a deflected CPB 706. A CPB lens 708 defines an aperture 709 through which the CPB 702 is directed to a specimen S. A deflector drive signal applied to the CPB deflector 704 can vary the deflection of the deflected CPB 706 so that the CPB 706 is selectively blocked by the CPB lens 708. The CPB transmitted by the aperture 709 is thus modulated, typically on/off modulated, but other modulations can be produced based on the applied deflection signal. A current amplifier 718 is coupled to the specimen S and/or the CPB lens 708 to sense CPB current. A controller 720 is coupled to receive an indication of the sensed beam current from the current amplifier 718 and to generate or initiate drive signals for the beam deflector 704 and the CPB source 701 to control CPB pulse production.

Figure 7B:
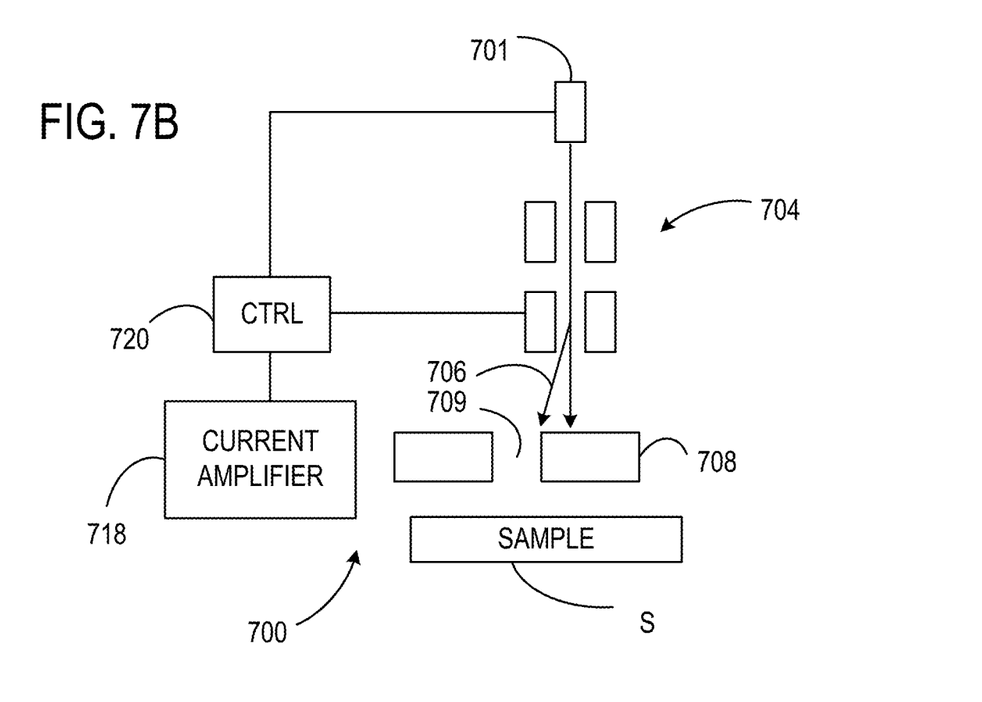

Referring to FIG. 7B, the CPB system 700 of FIG. 7A is arranged so that the CPB 702 is substantially blocked by the CPB lens 708, and only the deflected beam 706 is transmitted by the aperture 709.

Example 10

Figure 8:
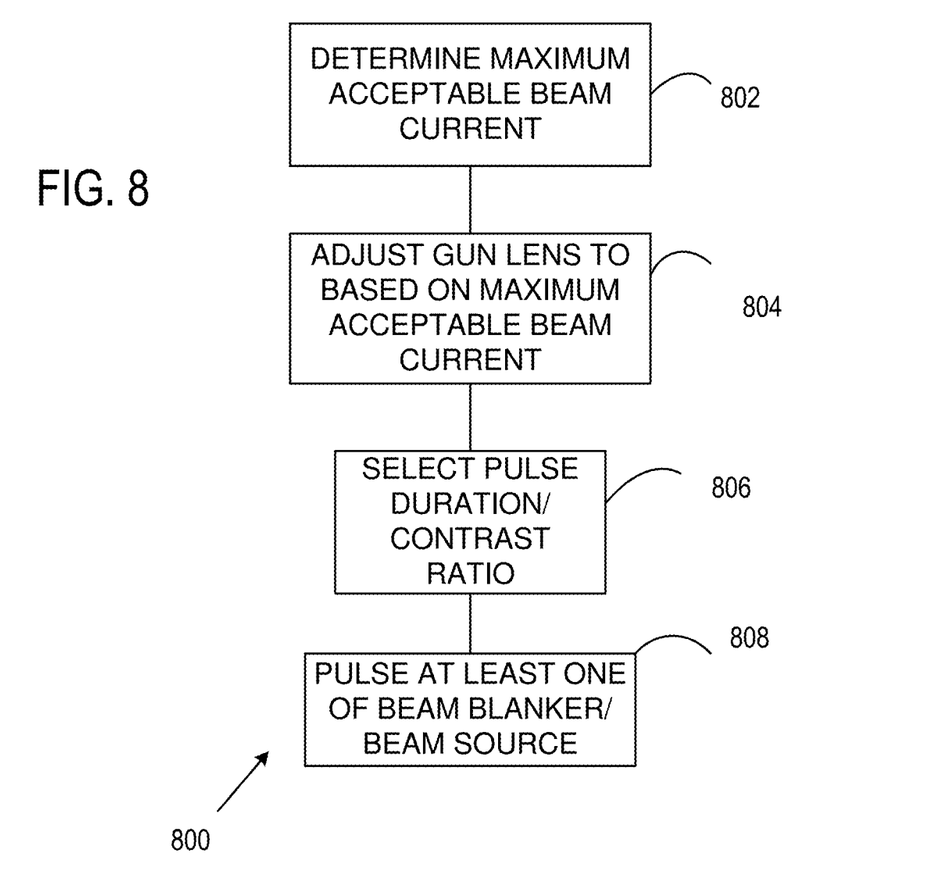
FIG. 8 illustrates another representative example of a method of producing CPB pulses.

Referring to FIG. 8, a representative method 800 includes determining a maximum acceptable CPB current at 802, typically a maximum average CPB current based on control of X-ray radiation. At 804, a gun lens is adjusted based on the acceptable CPB current. CPB pulse duration and contrast ratio are selected at 806, and at least one of a CPB blanker or CPB source are pulsed at 808 to provide suitable CPB pulses.

Example 11

Figure 9:
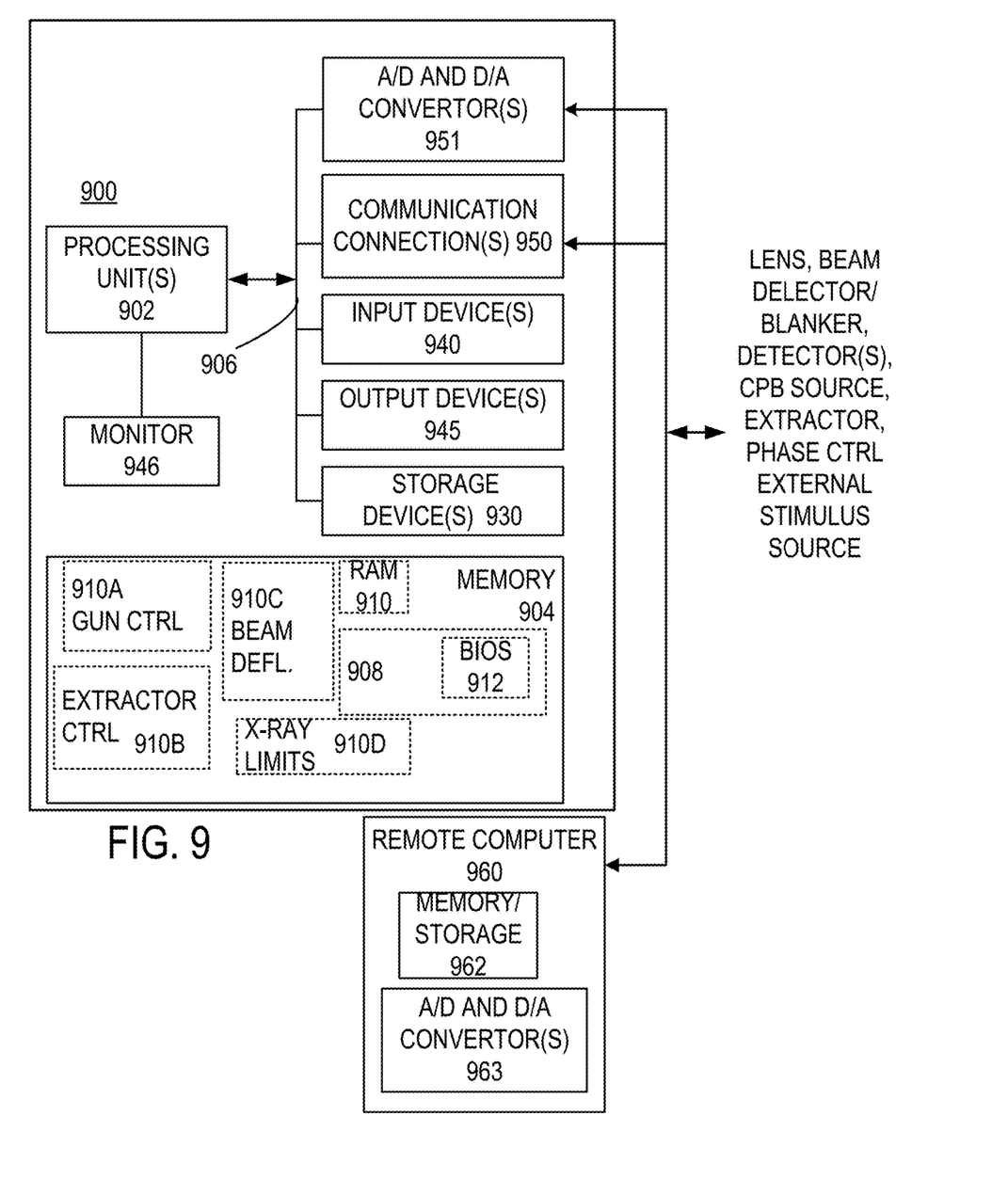
FIG. 9 illustrates a representative computing environment for implementing any of the disclosed systems and methods.

FIG. 9 and the following discussion are intended to provide a brief, general description of an exemplary computing environment in which the disclosed technology may be implemented. Moreover, the disclosed technology may be implemented with other computer system configurations, including hand held devices, multiprocessor systems, microprocessor-based or programmable consumer electronics, network PCs, minicomputers, mainframe computers, and the like. The disclosed technology may also be practiced in distributed computing environments where tasks are performed by remote processing devices that are linked through a communications network.

With reference to FIG. 9, an exemplary system for implementing the disclosed technology includes a general purpose computing device in the form of an exemplary conventional PC 900, including one or more processing units 902, a system memory 904, and a system bus 906 that couples various system components including the system memory 904 to the one or more processing units 902. The system bus 906 may be any of several types of bus structures including a memory bus or memory controller, a peripheral bus, and a local bus using any of a variety of bus architectures. The exemplary system memory 904 includes read only memory (ROM) 908 and random access memory (RAM) 910. A basic input/output system (BIOS) 912, containing the basic routines that help with the transfer of information between elements within the PC 900, is stored in ROM 908. In the example of FIG. 9, data and processor-executable instructions for control, analysis, imaging, and other operational modes of a CPB system including gun control, extractor drive signals, beam blankers or deflectors, and X-ray limiting values are stored in memory portions 910A, 910B, 910C, and 910D, respectively.

The exemplary PC 900 further includes one or more storage devices 930 such as a hard disk drive for reading from and writing to a hard disk, a magnetic disk drive for reading from or writing to a removable magnetic disk, and an optical disk drive. Such storage devices can be connected to the system bus 906 by a hard disk drive interface, a magnetic disk drive interface, and an optical drive interface, respectively. The drives and their associated computer readable media provide nonvolatile storage of computer-readable instructions, data structures, program modules, and other data for the PC 900. Other types of computer-readable media which can store data that is accessible by a PC, such as magnetic cassettes, flash memory cards, digital video disks.

A number of program modules may be stored in the storage devices 930 including an operating system, one or more application programs, other program modules, and program data. A user may enter commands and information into the PC 900 through one or more input devices 940 such as a keyboard and a pointing device such as a mouse. A monitor 946 or other type of display device is also connected to the system bus 906 via an interface, such as a video adapter.

The PC 900 may operate in a networked environment using logical connections to one or more remote computers, such as a remote computer 960. In some examples, one or more network or communication connections 950 are included and one or more A/D or D/A convertors 951, 963 are provided. The remote computer 960 may be another PC, a server, a router, a network PC, or a peer device or other common network node, and typically includes many or all of the elements described above relative to the PC 900, although only a memory storage device 962 has been illustrated in FIG. 9. The personal computer 900 and/or the remote computer 960 can be connected to a logical a local area network (LAN) and a wide area network (WAN).

General Considerations

As used in this application and in the claims, the singular forms "a," "an," and "the" include the plural forms unless the context clearly dictates otherwise. Additionally, the term "includes" means "comprises." Further, the term "coupled" does not necessarily exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and subcombinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections.

Examples are described with reference to directions indicated as "above," "below," "upper," "lower," and the like. These terms are used for convenient description, but do not imply any particular spatial orientation.

In the disclosed examples, CPBs and associated components are referred to as situated along an axis. Off-axis placements can be used as well. The disclosed methods are typically implemented with processor-executable instructions, with user inputs provided as needed with a keyboard, mouse or other pointing device, voice recognitions, or other type of input. User selections can be presented on one or more menus on a display and the user can be notified of the need for input via a visible alarm on a display or an audible alarm, or both.

As noted in some examples, CPB pulses can be provided using a combination of pulsing a CPB source and pulsing a beam blanker or beam deflector. CPB pulses can be synchronized to external reference signals such as optical or electrical signals, or external signals can be synchronized with CPB pulses. CPB pulses can also exhibit variable delays with respect to external reference signals. In some examples, beam deflectors are illustrated as lumped circuit elements, but traveling wave beam deflectors can also be used.

CPBs are referred to as substantially attenuated for beam currents that are reduced to at least 25%, 10%, 5%, 2.5%, 1%, or less of an incident beam current. CPBs are referred to as substantially transmitted for transmitted beams that have beam currents that are at least 50%, 60%, 70%, 75%, 89%, 90%, or more of an incident beam current.

In view of the many possible embodiments to which the principles of the disclosure may be applied, it should be recognized that the illustrated embodiments are only preferred examples and should not be taken as limiting the scope of the disclosure.

We claim:

1. A charged-particle-beam (CPB) system, comprising:
   a CPB source adapted to produce a CPB having a pulsed CPB component or a continuous CPB component, or both a pulsed CPB component and a continuous CPB component;
   a CPB lens situated to receive the CPB from the CPB source; and
   a controller coupled to the CPB lens and configured to:
     select either a first CPB beam focus or a second CPB focus, wherein the first CPB focus is situated to substantially attenuate a CPB at a beam limiting aperture, and the second CPB focus is situated so that the CPB is substantially transmitted by the beam limiting aperture;
     with the first CPB focus selected, activate the CPB source to produce at least a continuous component of the CPB and direct the continuous component to a target; and
     with the second CPB focus selected, produce at least a pulsed component of the CPB and direct the pulsed component to the target.

2. The CPB system of claim 1, further comprising an aperture plate that defines the beam limiting aperture.

3. The CPB system claim 1, wherein the CPB source comprises a field emitter.

4. The CPB system of claim 3, wherein the field emitter is a $LaB_6$ nanorod.

5. The CPB system of claim 3, wherein the controller is coupled to an extraction electrode, a suppression electrode, or a CPB lens that is operable to establish a beam current of at least one of the pulsed CPB component and the continuous CPB component.

6. The CPB system of claim 1, wherein the CPB source is operable to establish a beam current of the pulsed CPB component.

7. The CPB system of claim 1, further comprising a beam blanker situated to receive the CPB from the beam limiting aperture, wherein the controller is operable to energize the beam blanker to selectively deflect the received CPB.

8. The CPB system of claim 7, further comprising a blanking aperture plate that defines a blanking aperture, wherein the beam blanker is operable to selectively deflect the CPB to the blanking aperture to block at least a portion of the received CPB.

9. The CPB system of claim 7, wherein the beam blanker comprises an electrostatic deflector.

10. The CPB system of claim 7, wherein the beam blanker comprises an RF resonant cavity.

11. The CPB system of claim 7, wherein the controller is coupled to the CPB lens to focus the CPB at the beam blanker.

12. The CPB system of claim 7, further comprising X-ray shielding situated about a CPB beam axis and defining an X-ray shielded region, wherein the beam limiting aperture is situated within the X-ray shielded region.

13. The CPB system of claim 12, wherein the CPB source is situated to direct the CPB to be blocked by the blanking aperture when the beam blanker is not actuated.

14. The CPB system of claim 12, wherein the CPB lens is configured to produce a CPB focus situated between the beam limiting aperture and the blanking aperture.

15. A CPB method, comprising:
    selecting either a first CPB beam focus or a second CPB focus, wherein the first CPB focus is situated to substantially attenuate a CPB at the beam limiting aperture, and the second CPB focus is situated so that the CPB is substantially transmitted by the beam limiting aperture;
    with the first CPB focus selected, activating a CPB source to produce at least a continuous component of the CPB and directing the continuous component to a target; and
    with the second CPB focus selected, producing at least a pulsed component of the CPB and directing the pulsed component to the target.

16. The method of claim 15, wherein the continuous component is produced with a field emitter in response to continuous activation of an extractor and the pulsed component is produced with pulsed activation of one or more of the field emitter, the extractor, a suppression electrode, or a CPB lens.

17. The method of claim 16, further comprising:
    directing the CPB portion associated with the pulsed component to a beam blanker; and
    with the beam blanker, selectively attenuating the pulsed component to define a CPB pulse duration or a CPB contrast ratio, or both a CPB pulse duration and contrast ratio.

18. The method of claim 15, further comprising, with the second CPB focus selected, producing a pulsed CPB with a beam blanker to establish a pulsed CPB pulse duration, contrast ratio, or both pulse duration and contrast ratio.

19. The method of claim 15, wherein the first CPB focus is selected to substantially attenuate the CPB at the beam limiting aperture in an X-ray shielded region.

20. A CPB method, comprising:
    providing a CPB source that includes a field emitter and an extractor;
    situating a CPB lens to receive a CPB from the CPB source;
    situating a beam limiting aperture in an X-ray shielded region; and
    providing a controller coupled to the CPB lens to produce a CPB focus at the beam limiting aperture to produce a pulsed CPB or to produce an expanded beam at the beam limiting aperture to produce a continuous CPB.

* * * * *